United States Patent
Krishnamurthy et al.

(10) Patent No.: US 11,003,804 B2
(45) Date of Patent: May 11, 2021

(54) CONTAINER LOADING/UNLOADING TIME ESTIMATION

(71) Applicant: SYMBOL TECHNOLOGIES, LLC, Lincolnshire, IL (US)

(72) Inventors: Adithya H. Krishnamurthy, Hicksville, NY (US); Miroslav Trajkovic, Setauket, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 461 days.

(21) Appl. No.: 15/852,993

(22) Filed: Dec. 22, 2017

(65) Prior Publication Data

US 2019/0197195 A1    Jun. 27, 2019

(51) Int. Cl.
   *G06Q 10/08* (2012.01)
   *G06F 30/00* (2020.01)
   *F25D 11/00* (2006.01)

(52) U.S. Cl.
   CPC ............. *G06F 30/00* (2020.01); *G06Q 10/08* (2013.01); *G06Q 10/083* (2013.01); *F25D 11/003* (2013.01); *G06Q 10/0833* (2013.01)

(58) Field of Classification Search
   None
   See application file for complete search history.

(56) References Cited

U.S. PATENT DOCUMENTS

| | | | |
|---|---|---|---|
| 9,460,524 B1* | 10/2016 | Curlander | G01F 22/00 |
| 9,940,730 B2* | 4/2018 | Zhang | G06T 7/62 |
| 10,332,058 B1* | 6/2019 | Kandregula | G06Q 10/083 |
| 2003/0106370 A1 | 6/2003 | Fearnside et al. | |
| 2004/0193466 A1* | 9/2004 | Kull | G06Q 10/08 705/28 |
| 2006/0251498 A1* | 11/2006 | Buzzoni | B65G 63/004 414/139.9 |
| 2009/0164345 A1* | 6/2009 | Pierce | G06Q 10/0875 705/29 |
| 2009/0191028 A1* | 7/2009 | Tian | B65G 63/004 414/140.3 |
| 2013/0098460 A1 | 4/2013 | Elong et al. | |

(Continued)

OTHER PUBLICATIONS

International Search Report and Written Opinion for International Application No. PCT/US2018/060908 dated Jan. 24, 2019.

*Primary Examiner* — Kibrom K Gebresilassie
(74) *Attorney, Agent, or Firm* — Yuri Astvatsaturov (57) ABSTRACT

Embodiments of the present invention are generally directed to system and methods for estimating the time associated with completion of loading and/or unloading of a container. In an embodiment, the present invention is a method of estimating an estimated time to completion (ETC) of loading a container. The method includes: capturing, via an image capture apparatus, a three-dimensional image representative of a three-dimensional formation, the three-dimensional image having a plurality of points with three-dimensional point data; based at least in part on a first sub-plurality of the points, determining an active load time for the container; based at least in part on a second sub-plurality of the points, determining a fullness of the container; and estimating, by a controller, the ETC based on the active load time and on the fullness.

17 Claims, 7 Drawing Sheets

(56) References Cited

U.S. PATENT DOCUMENTS

| | | | |
|---|---|---|---|
| 2013/0133310 A1* | 5/2013 | Liljestrand | F01N 3/2066 |
| | | | 60/274 |
| 2014/0009612 A1* | 1/2014 | King | G06K 19/06028 |
| | | | 348/143 |
| 2014/0055560 A1* | 2/2014 | Fu | G06T 7/40 |
| | | | 348/42 |
| 2014/0290790 A1 | 10/2014 | Mathison | |
| 2014/0368329 A1 | 12/2014 | Brown et al. | |
| 2014/0372182 A1* | 12/2014 | Groble | G06Q 10/04 |
| | | | 705/7.38 |
| 2014/0372183 A1* | 12/2014 | Groble | G06Q 50/28 |
| | | | 705/7.38 |
| 2015/0170256 A1* | 6/2015 | Pettyjohn | G06F 3/04812 |
| | | | 705/14.49 |
| 2016/0216028 A1* | 7/2016 | Jonsson | F25D 29/003 |
| 2016/0239795 A1* | 8/2016 | Burch, V | G06Q 50/28 |
| 2016/0239802 A1* | 8/2016 | Burch, V | G06Q 10/0833 |
| 2017/0055446 A1* | 3/2017 | Nykamp | A01D 43/073 |
| 2017/0140550 A1 | 5/2017 | Zhang et al. | |
| 2019/0176621 A1* | 6/2019 | Cardona | B60P 1/04 |

* cited by examiner

CONTAINER LOADING/UNLOADING TIME ESTIMATION

BACKGROUND

Goods can be transported in many different ways using many different methods. Long-haul transportation in particular often employs containers which can be loaded with goods and thereafter moved by vehicles, trains, marine vessels, or airplanes to their desired destinations. While not always relying on detachable containers, short-haul goods transport similarly uses vehicles like delivery trucks/box trucks which have attached containers for storage of items and freight.

In the past, most loading or unloading of goods was performed without significant input from computerized systems. However, with the evolution of computing capabilities, the availability of sensed environmental data, and the ever-increasing focus on efficiency, today's loading and unloading procedures are monitored, supervised, and/or assisted by computing platforms that can act on information in an instance. One aspect that is of particular importance is the estimation of time required to load or unload a container. Knowing the estimated time of completion for loading or unloading a shipment can allow for more efficient planning of resource like people and loading equipment. It can also help with the appropriate routing of containers to the appropriate loading bays to improve loading-bay utilization. Moreover, supervisors can streamline the loading and unloading processes by quickly identifying situations where the movement of freight is slower than expected.

Accordingly, there exists a need for improved systems and methods that can provide an ETC for loading and/or unloading of containers like shipping containers, trailers, delivery trucks, and so on.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

As used herein, the term "container" shall refer to any container transportable by at least one of a vehicle, a train, a marine vessel, and airplane, and configured to store transportable goods such as boxed and/or unboxed items and/or other types of freight. Accordingly, an example of a container includes an enclosed container fixedly attached to a platform with wheels and a hitch for towing by a powered vehicle. An example of a container also includes an enclosed container removably attached to a platform with wheels and a hitch for towing by a powered vehicle. An example of a container also includes an enclosure that is fixedly attached to a frame of a powered vehicle, such as the case may be with a delivery truck, box truck, etc. As such, while the exemplary embodiment(s) described below may appear to reference one kind of a container, the scope of the invention shall extend to other kinds of containers, as defined above.

In an embodiment, the present invention is a method of estimating an estimated time to completion (ETC) of loading a container. The method includes: capturing, via an image capture apparatus, a three-dimensional image representative of a three-dimensional formation, the three-dimensional image having a plurality of points with three-dimensional point data; based at least in part on a first sub-plurality of the points, determining an active load time for the container; based at least in part on a second sub-plurality of the points, determining a fullness of the container; and estimating, by a controller, the ETC based on the active load time and on the fullness.

In another embodiment, the present invention is a method of estimating an ETC of unloading a container. The method includes: capturing, via an image capture apparatus, a three-dimensional image representative of a three-dimensional formation, the three-dimensional image having a plurality of points with three-dimensional point data; based at least in part on a first sub-plurality of the points, determining an active unload time for the container; based at least in part on a second sub-plurality of the points, determining a fullness of the container; and estimating, by a controller, the ETC based on the active unload time and on the fullness.

In still another embodiment, the present invention is container monitoring unit (CMU) for estimating an ETC of loading a container. The CMU includes: a housing; an imaging assembly at least partially within the housing and operable to capture a three-dimensional image representative of a three-dimensional formation, the three-dimensional image having a plurality of points with three-dimensional point data; and a controller communicatively connected to the imaging assembly. The controller operable to: analyze a first sub-plurality of the points to determining an active load time for the container; analyze a second sub-plurality of the points to determining a fullness of the container; and estimate the ETC based on the active load time and on the fullness.

Figure 1:
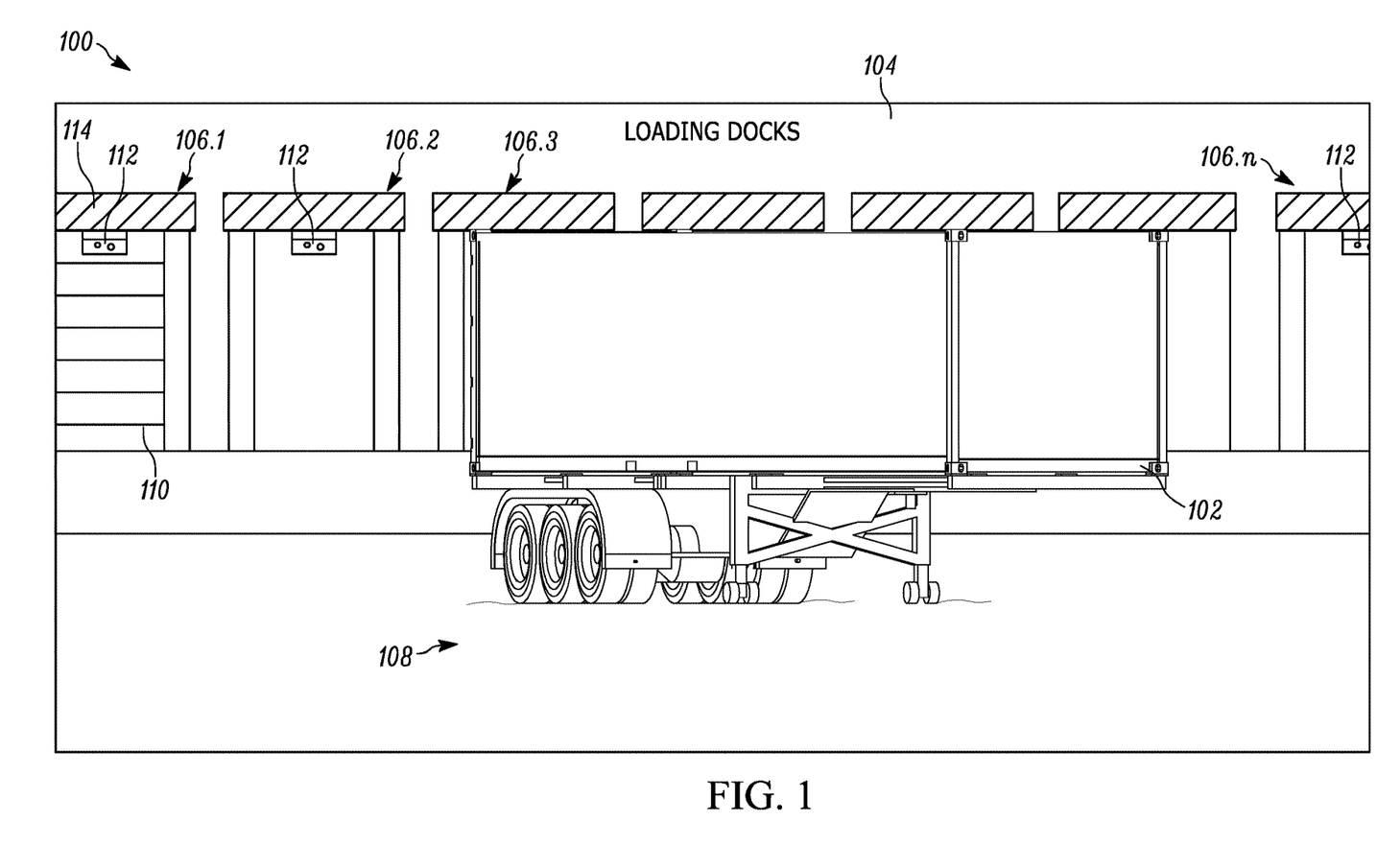
FIG. 1 illustrates a loading facility in accordance with an embodiment of the present invention.

Referring now to the drawings, FIG. 1 illustrates an exemplary environment where embodiments of the present invention may be implemented. In the present example, the environment is provided in a form of a loading dock 100 (also referred to as a loading facility) where containers 102 are loaded with various goods and/or where various goods are unloaded from the containers 102. The loading dock 100 is comprised of a facility 104 having a plurality of loading bays 106.1-106.n facing a loading facility lot 108 where vehicles, such as semis (not shown), deliver and pick up containers 102. To be loaded, each container 102 is backed toward the facility 104 such that it is generally perpendicular with the wall having the loading bays 106, and in line with one of the loading bays (in this case 106.3). As illustrated, each loading bay 106 includes a bay door 110 that can be lowered to close the respective loading bay 106 or raised to open the respective loading bay allowing the interior of the facility 104 to be accessible therethrough. Additionally, each loading bay 106 is provided with a container monitoring unit (CMU) 112. The CMU is mounted near the container loading area, preferably in the upper section of the loading bay 106 outside the door 110 facing the loading facility lot 108 or an interior/rear of a container 102 if one is docked at the respective loading bay. To protect the CMU from inclement weather, it could be mounted under a bay awning 114. Once docked, goods can be loaded onto/unloaded from the container 102 with the CMU 112 maintaining a view of the rear/inside of the container.

Figure 2:
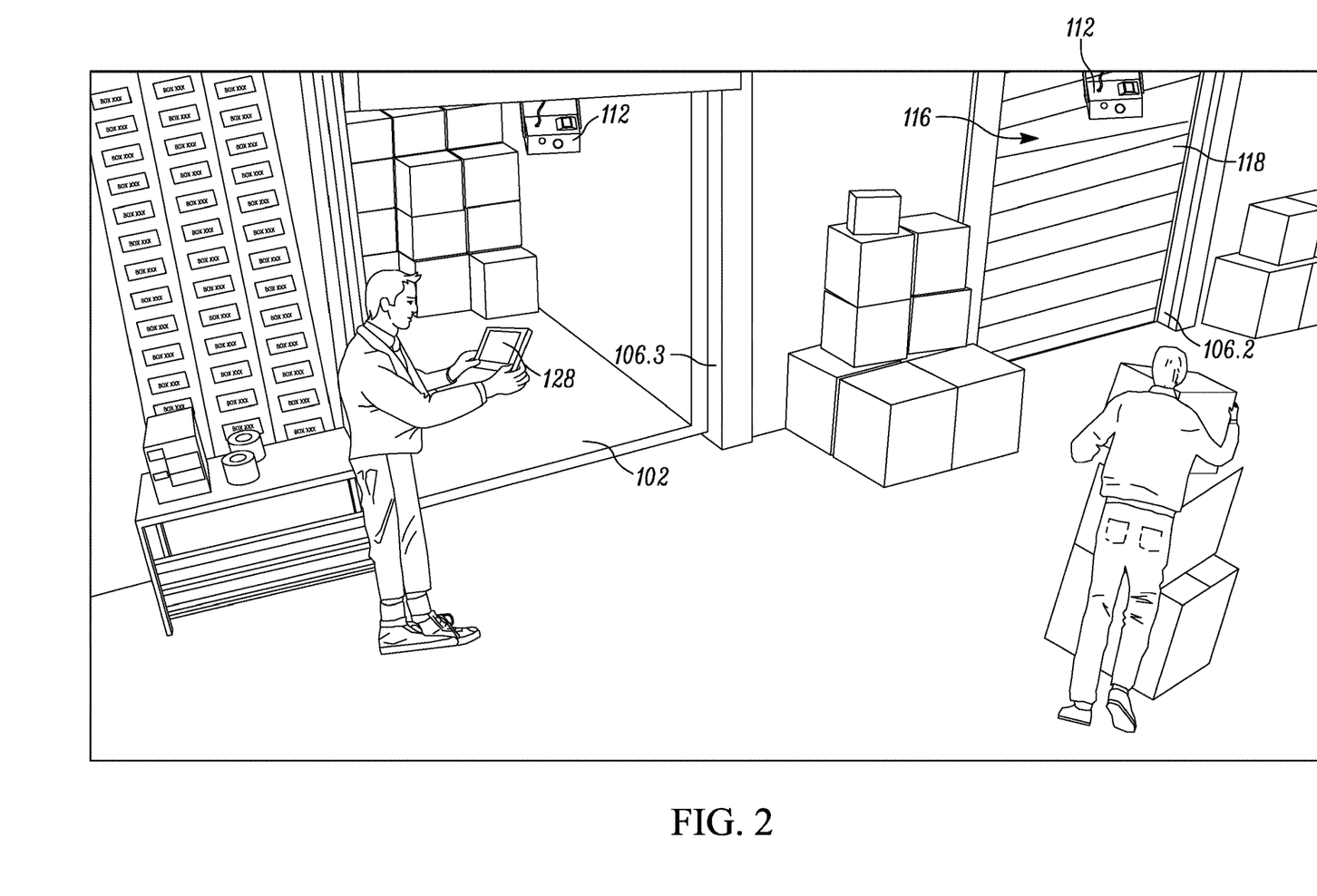
FIG. 2 illustrates an interior of the loading facility of FIG. 1.

FIG. 2 is an exemplary perspective view of the loading facility 104 of FIG. 1, as seen from the inside, depicting container 102 docked at a loading bay 106.3 with an open container door and container 116 docked at a loading bay 163.2 with a closed container 118. To help determine the status of the container door, the CMU 112 is employed, as described further below.

Figure 3:
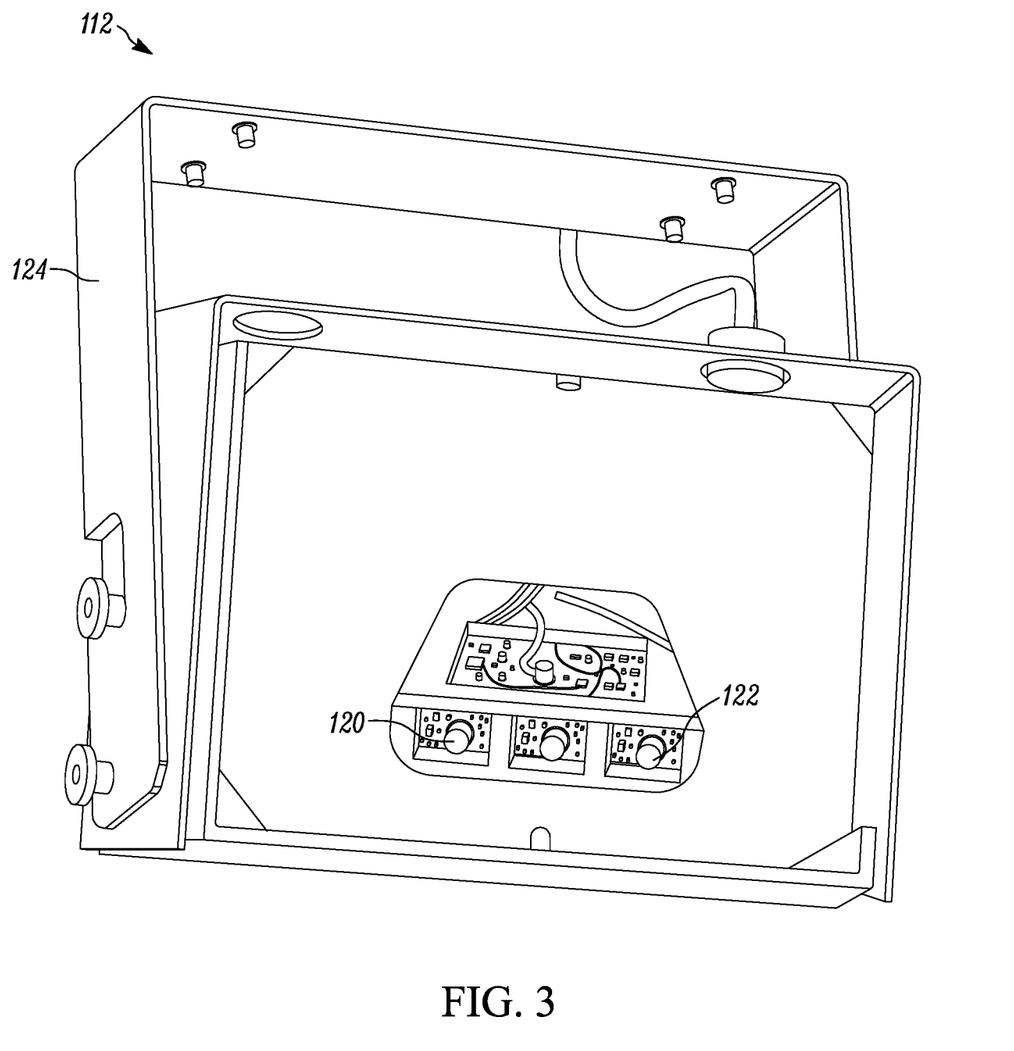
FIG. 3 illustrates a container monitoring unit in accordance with an embodiment of the present invention.

In the currently described embodiment and as shown in FIG. 3, the CMU 112 is a mountable device that includes a 3D-depth camera 120 for capturing 3D (three dimensional) images (e.g., 3D image data comprised of a plurality of points with three-dimensional point data) and a 2D camera 122 for capturing 2D images (e.g., 2D image data). The 2D camera may be an RGB (red, green, blue) camera for capturing 2D images. The CMU 112 also includes one or more processors and one or more computer memories for storing image data, and/or for executing application/instructions that perform analytics or other functions as described herein. For example, the CMU 112 may include flash memory used for determining, storing, or otherwise processing the imaging data and/or post-scanning data. In addition, CMU 112 may further include a network interface to enable communication with other devices (such as server 130). The network interface of CMU 112 may include any suitable type of communication interface(s) (e.g., wired and/or wireless interfaces) configured to operate in accordance with any suitable protocol(s). In various embodiments, and as shown in FIGS. 1 and 2, the CMU 112 is mounted via a mounting bracket 124 and oriented in the direction of docked containers to capture 3D and/or 2D image data of the interior and exterior thereof.

In an embodiment, to capture 3D image data, the 3D depth camera 120 includes an Infra-Red (IR) projector and a related IR camera. The IR projector projects a pattern of IR light or beams onto an object or surface, which may include surfaces of the container 102 (like the door, walls, floor, etc.), objects within the interior of the container (like boxes, packages, temporary shipping equipment, etc.), and/or surfaces of the loading facility lot 108 (like the surface of the loading facility lot on which the containers are parked). The IR light or beams may be distributed on the object or surface in a pattern of dots or points by the IR projector, which may be sensed or scanned by the IR camera. A depth-detection application, such as a depth-detection application executing on the one or more processors or memories of CMU 112, can determine, based on the pattern of dots or points, various depth values, for example, depth values of the interior of the container 102. For example, a near-depth object (e.g., nearby boxes, packages, etc.) may be determined where the dots or points are dense, and distant-depth objects (e.g., far boxes, packages, etc.) may be determined where the points are more spread out. The various depth values may be used by the depth-detection application and/or CMU 112 to generate a depth map. The depth map may represent a 3D image of, or contain 3D image data of, the objects or surfaces that were sensed or scanned by the 3D-depth camera 120.

Additionally, in an embodiment, to capture 2D image data, the 2D camera 122 includes an RGB (red, green, blue) based camera for capturing 2D images having RGB-based pixel data. In some embodiments, the 2D camera 122 captures 2D images, and related 2D image data, at the same or similar point in time as the 3D-depth camera 120 such that the CMU 112 can have both sets of 3D image data and 2D image data available for a particular surface, object, or scene at the same or similar instance in time.

Figure 4A:
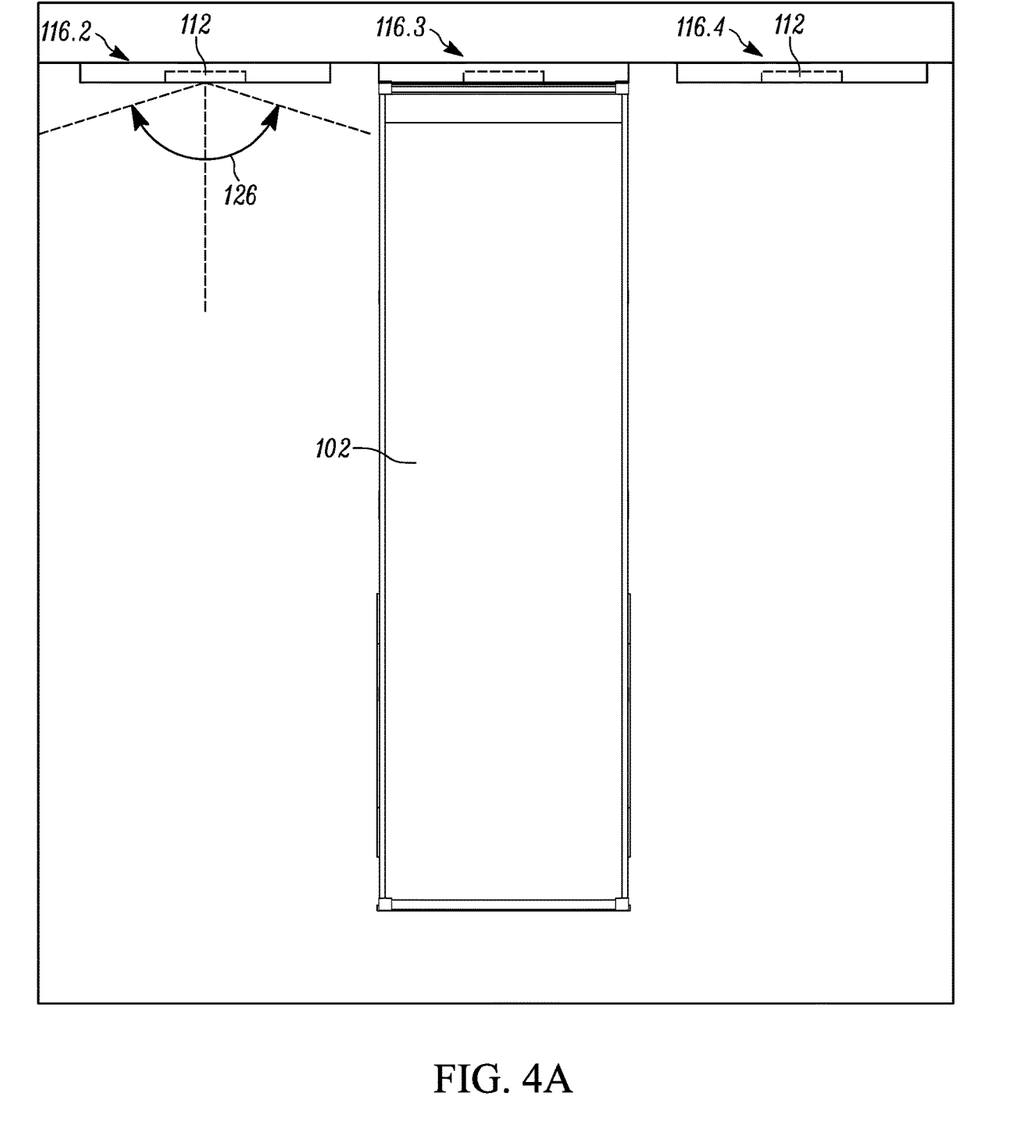
FIG. 4A illustrates a top-down view of the loading facility of FIG. 1 showing an exemplary field of view of a container monitoring unit.
Figure 4B:
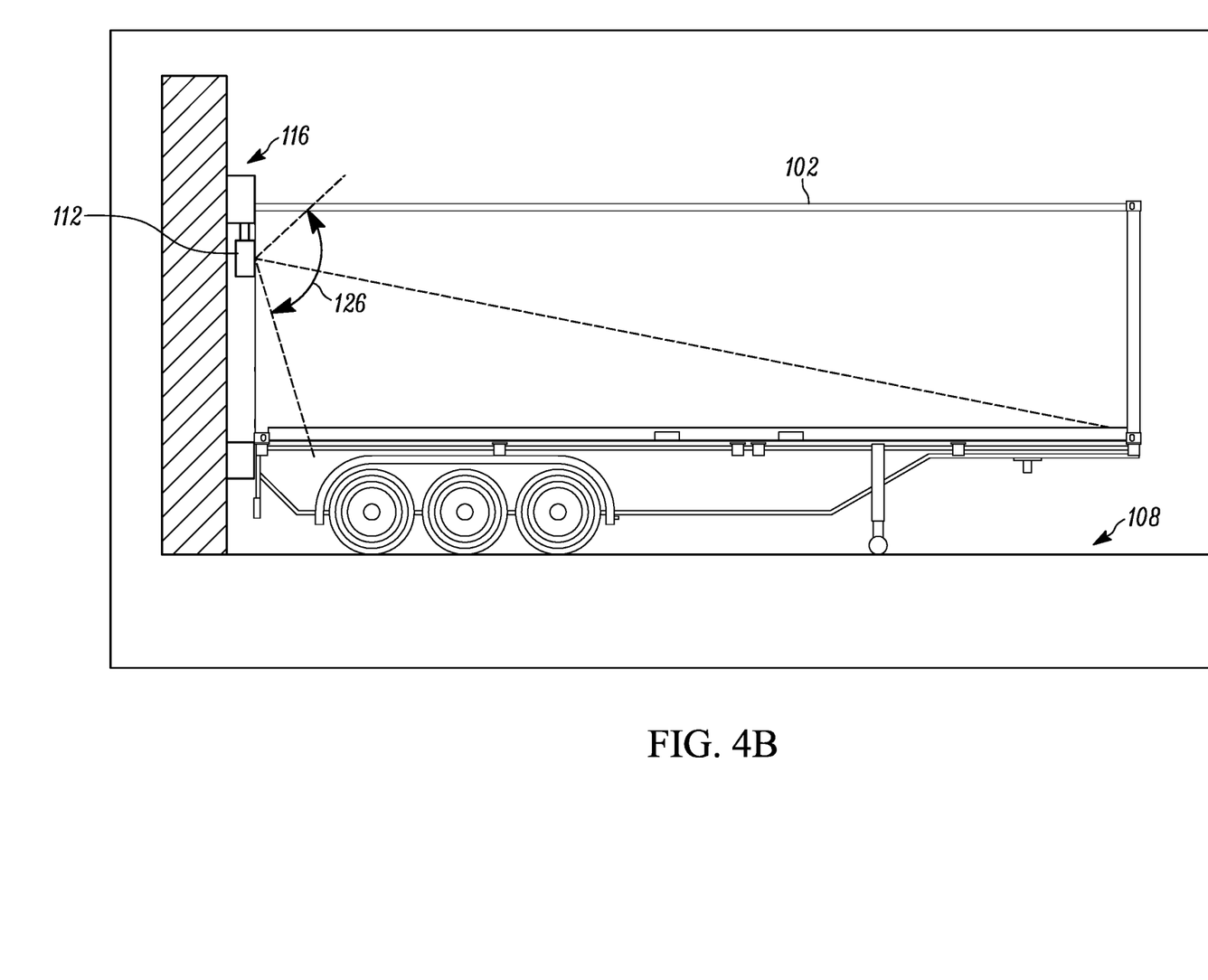
FIG. 4B illustrates a side view of the loading facility of FIG. 1 showing an exemplary field of view of a container monitoring unit.

Referring to FIGS. 4A and 4B, the CMU can be oriented such that its fields of view (FsOV) 126 for the 3D camera and the 2D camera expand to capture a majority of the interior of the container. Additionally, both FsOV can substantially overlap to capture data over substantially the same area. As a result, the CMU 112 can scan, sense, or otherwise capture image data from the walls, floor, ceiling, packages, or other objects or surfaces within the container to determine the 3D and 2D image data. Similarly, when a container is absent from the loading bay, the CMU can scan, sense, or otherwise capture image data from the loading facility lot 108 surface to determine the 3D and 2D image data. The image data may be processed by the one or more processors and/or memories of the CMU 112 (or, in some embodiments, one or more remote processors and/or memories of a server) to implement analysis, functions, such as graphical or imaging analytics, as described by the one or more various flowcharts, block diagrams, methods, functions, or various embodiments herein.

Figure 5:
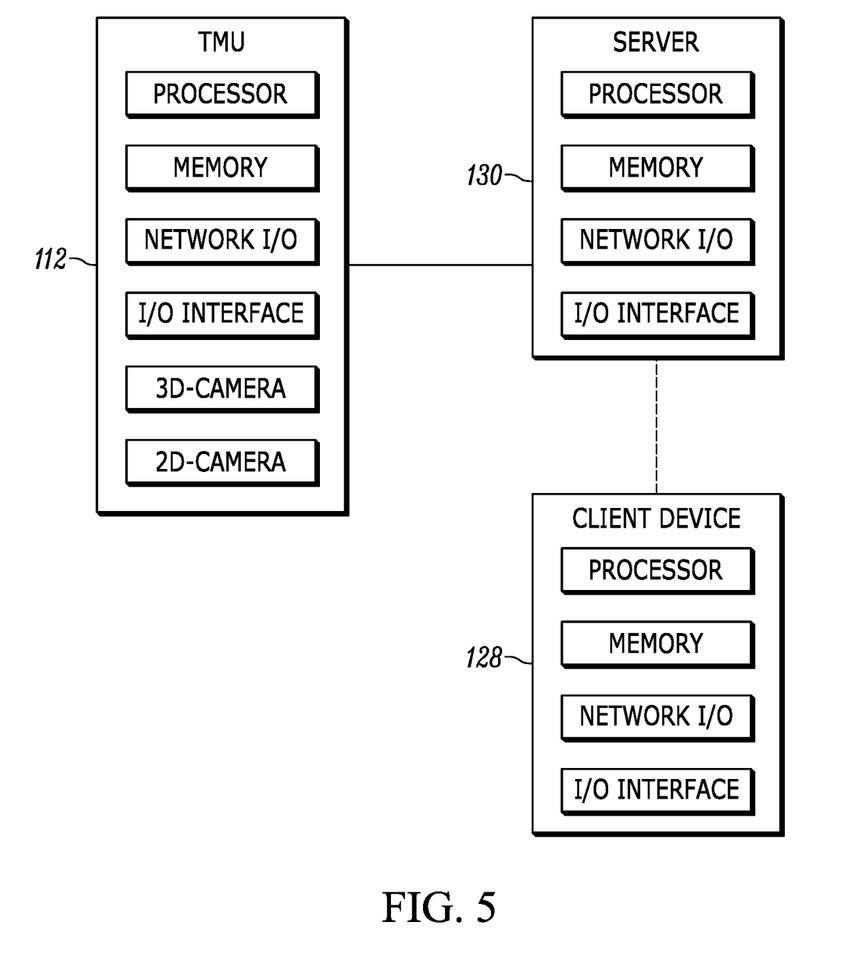
FIG. 5 illustrates an exemplary block diagram schematic of a communication network implemented in the facility of FIG. 1.

In some embodiments, the CMU 112 processes the 3D and 2D image data for use by other devices (e.g., client device 128 (which can be in a form of a mobile device, such as a tablet, smartphone, laptop, or other such mobile computing device), or server 130 (which can be in a form of a single or multiple computers operating to manage access to a centralized resource or service in a network)). The processing of the image data may generate post-scanning data that may include metadata, simplified data, normalized data, result data, status data, or alert data as determined from the original scanned or sensed image data. As shown in FIG. 5, which illustrates a block connection diagram between the CMU 112, server 130, and client device 128, these devices may be connected via any suitable communication means, including wired and/or wireless connectivity components that implement one or more communication protocol standards like, for example, TCP/IP, WiFi (802.11b), Bluetooth, Ethernet, or any other suitable communication protocols or standards.

In some embodiments, the server 130 may be located in the same loading facility 104. In other embodiments, server 130 may be located at a remote location, such as on a cloud-platform or other remote location. In still other embodiments, server 130 may be formed of a combination of local and cloud-based computers.

Server 130 is configured to execute computer instructions to perform operations associated with the systems and methods as described herein. The server 130 may implement enterprise service software that may include, for example, RESTful (representational state transfer) API services, message queuing service, and event services that may be provided by various platforms or specifications, such as the J2EE specification implemented by any one of the Oracle WebLogic Server platform, the JBoss platform, or the IBM Web Sphere platform, etc. Other technologies or platforms, such as Ruby on Rails, Microsoft .NET, or similar may also be used.

To assist with the reporting of estimated time of completion (ETC) of loading and/or unloading of a container, the aforementioned components may be used, alone or in combination, to detect and/or provide various measurements of the interior of the container docked at a loading bay and use those measurements (i.e., data) to conduct the necessary analytics.

Figure 6:
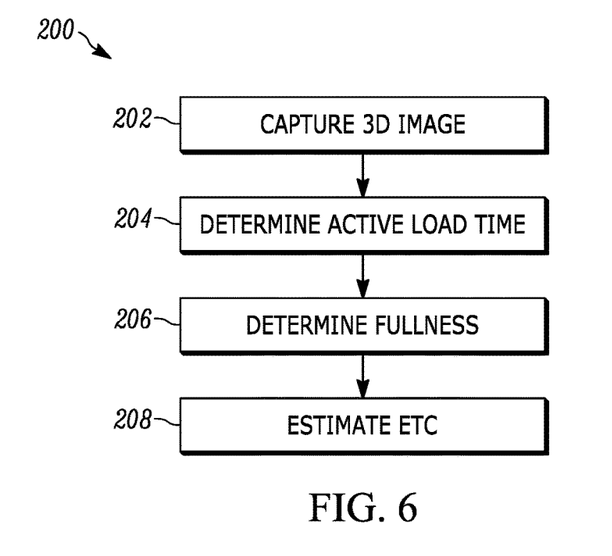
FIG. 6, illustrates a flowchart representative of a method of estimating an estimated time to completion (ETC) of loading a container, in accordance with an embodiment of the present invention.

Referring to FIG. 6, shown therein is a flowchart representative of an exemplary method 200 of estimating an ETC of loading a container. In step 202, the method includes the operation of capturing, via an image capture apparatus, a three-dimensional image representative of a three-dimensional formation, the three-dimensional image having a plurality of points with three-dimensional point data. The image capture apparatus can be implemented via the CMU 112 that is configured to capture 3D images. It is preferable to oriented the image capture apparatus such that its 3D FOV extend into the area of the loading facility lot, and more specifically, into the area where a trailer (such as trailer 102) is expected to be positioned during loading and unloading procedures. This configuration allows the image capture apparatus to sense (by capturing and analyzing 3D data) the presence or absence of various objects in the vicinity of its FOV, and make various determinations based thereon.

Next, in step 204 the method includes the operation of determining an active load time for the container. This operation can be carried out by the controller of the CMU itself, by the controller of the server 130, or a combination thereof. In some implementations, the determination of the active load time can be made by subtracting an idle load time from a total elapsed load time. For example, if the total elapsed load time is determined to be 5 hours and the idle load time is determined to be 1 hours, the active load time would be 4 hours.

In some embodiments, the total elapsed load time is calculated from the instance that a container door is opened to an instance in time. In some embodiments, this time can also be calculated from the moment that the container is property docked at a container loading area, or from a moment that a first loader (human or non-human) enters the interior of the container. In some embodiments, the idle load time is generally viewed as the time that no loading is occurring. This can be monitored, for example, via motion detection where, for instance, the cumulative time that no movement occurs within the trailer is considered to be the idle loading time. In other instances, the analysis may be more selective in that only the movement (or lack thereof) of goods within the container may be taken into account for calculating idle load time. In this case, it may be necessary to disregard some of the points of the 3D image, focusing only on a certain sub-plurality that represents the goods of interest. For the lack of movement to be a contributor to the overall idle load time, it may be preferable to consider a lack of movement over some sample of time having a finite length. As such, if, for example, no movement occurs over a period of 1 minute, that period will be added to the idle load time.

Next, in step 206, method 200 includes the operation of determining a fullness of the container. This value can be expressed as a percentage and can represent an estimate of the volume occupied by the goods within the container relative to the overall volume. It may be calculated by, for example, obtaining a total volume of the container, determining the volume of each item within the container, summing the individual volumes together to obtain a combined occupied volume, and calculating what fraction of the total volume is occupied by the combined occupied volume.

In other implementations, the fullness may be derived with reference to the three-dimensional point data captured within the three-dimensional image. For example, in some implementations fullness may be based on the depth measurements of at least some portions of the load wall. The load wall may be comprised of surfaces that substantially face the image capture apparatus and/or a container door near which the image capture apparatus is mounted (i.e., within 0-45 degrees of facing the image capture apparatus and/or a container door near which the image capture apparatus is mounted) and are substantially orthogonal to the container floor.

The determination of a substantially flat shape itself can be performed via 3D imaging segmentation analysis. In some embodiments, sample consensus (SAC) segmentation analysis may be used to determine points in the 3D image data that correspond to different planes or surfaces. This can be applied to a wide variety of surfaces, including interior and exterior surfaces of the trailer (e.g., internal walls, floor, ceiling, and external surfaces like the exterior side of the door) and also surfaces of objects located within the trailer itself. SAC segmentation analysis determines, or segments, the different planes or surfaces of the environment into x, y, z coordinate planes by identifying a correlation of common points along x, y, z planes oriented within the 3D image data. As such, this method may be used to analyze a certain plurality of points within the 3D image and identify a presence of a plane corresponding to a substantially flat surface. Additionally, one may also determine whether a variance of the respective depth values of the second sub-plurality of the plurality of points is within a predetermined depth-variance threshold, the variance being within the predetermined depth-variance threshold being an indicator that the three-dimensional formation is substantially flat.

Figure 7:
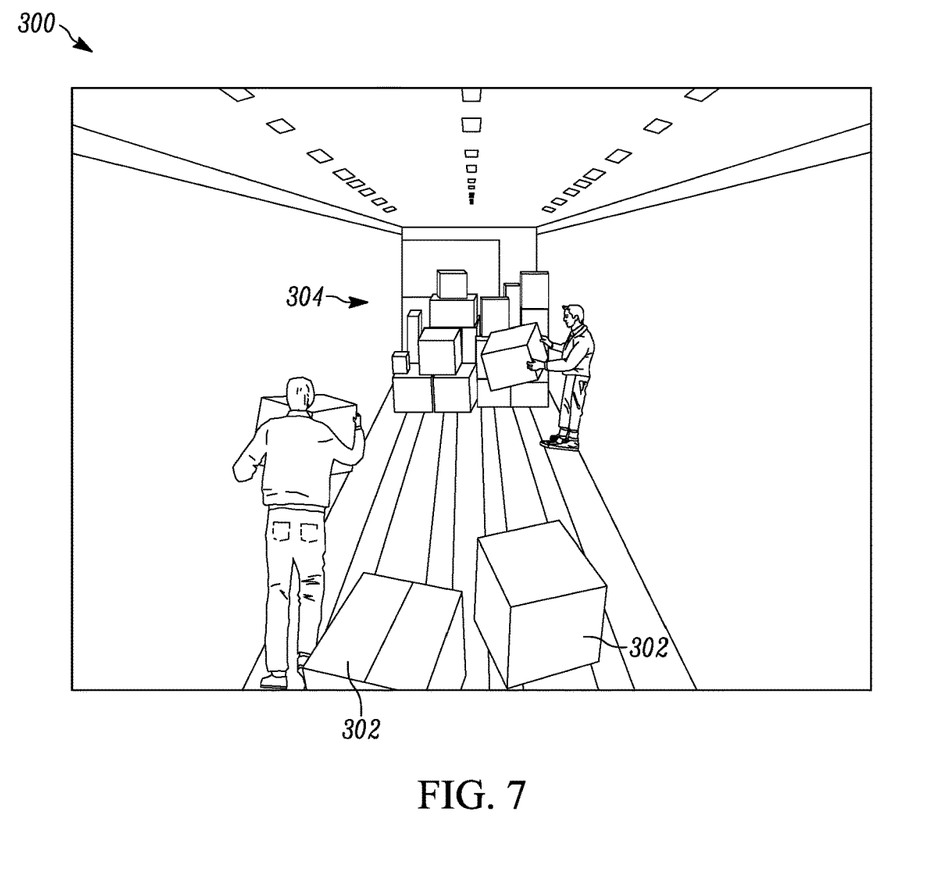
FIG. 7 illustrates an example of a container being loaded or unloaded.

With reference to FIG. 7 which illustrates an example image 300 of a container being loaded or unloaded, in some case, goods 302 that are staged on the container floor are not viewed as being a part of the load wall 304 for purposes of fullness calculations. In other cases, the staged goods 302 are also considered to be a part of the load wall and their depth is also considered in determining the overall fullness of the container. To determine the fullness, in some implementations, it is possible to determine an average depth value of at least a portion of the load wall, subtract the determined average depth value from the total depth of the container to obtain an estimated occupied depth, and divide the estimated occupied depth by the total depth. This provides the percentage of the overall volume (expressed as a decimal) that is estimated to occupy space within the container at the time of estimation. As an example, if the average depth measurement of the container is determined to be at 20 feet and the total depth of the container is 80 feet, calculations above yield a result of 0.75, indicating that an estimated 75% of the container is occupied. Since this approach to detecting fullness may consider only some of the surfaces within the 3D image, the analysis may rely on only a sub-plurality of points within the 3D image.

Finally, in step 208 of method 200, the ETC is estimated by relying on the active load time and on the fullness of the container. In an example, the estimate of the ETC is provided by the following equation:

$$ETC = t_l\left(\frac{1}{f} - 1\right) \quad (1)$$

where $t_l$ is the active load time, and where f is the fullness expressed as a percentage in decimal form. Taking the exemplary values of $t_l$=4 hours and f=0.75 from the examples above, equation (1) yields result of ETC=1.3$\overline{3}$, or 1 hour and 20 minutes, indicating that this is approximately how long it will take to fill the container to 100% capacity. It will be appreciated that the formula of equation (1) or the computations that form the basis of equation (1) may be modified to provide an ETC to completion for any desire capacity threshold. That is, in some examples there may be reason to estimate a time to completion of loading a container to 90% capacity rather than 100% capacity. In an embodiment, this can be achieved by adjusting the fullness calculation to rely not on the total depth of the container, but only on 90% of the total depth. In another embodiment, the equation may be modified as follows:

$$ETC = t_l\left(\frac{D}{f} - 1\right) \quad (2)$$

where D is the percentage (expressed as a decimal) of the total depth of the container to which the loading is desired to be estimated.

It should be pointed out that the operations described above can be executed on any of the controllers of FIG. 5. For instance, upon capturing 3D data, the CMU 112 can transfer all needed data to the server 130 so that the server's controller conducts all necessary operations. In another implementation, all the steps can be executed on the controller of the CMU 112 itself. In still another implementation, operations may be split between the CMU 112 and the server 130. Once the ETC is determined, it may be used by any of the components of FIG. 5. As an example, it can be sent to the client device 128 for display to the client. In another example, it can be added to a then-current time to provide an estimate time of completion of loading the trailer. In yet another example, server 130 may use the ECT for scheduling, dispatch, and so on.

While the method of FIG. 6 was described in reference to estimating time to complete the loading of a container, a similar approach can be used to estimate a time to complete an unloading of a container. In this case, the estimate must determine a projected time that the estimated occupied volume within the container will be vacated therefrom. In an example, this can be determined by modifying equation (1) as follows:

$$ETC = t_l\left(\frac{1}{(1-f)} - 1\right). \quad (3)$$

where $t_l$ is the active unload time and where f is the fullness expressed as a percentage in decimal form. The result provides an estimation of time needed to remove all items that remain on in the container. Another way to view equation (3) is to note that it is relying on a measure of emptiness of the container (which it is getting by subtracting the fullness from 1). Since fullness can be derived by determining the average depth of a load wall and subtracting it from the total depth, emptiness can be determined by simply relying on the average depth of the load wall without its subtraction from the total depth. In other embodiments, either emptiness or fullness can be measured from a point that can be considered a starting point that is not necessarily an edge of a container. This may be particularly advantageous when unloading a container that was not fully stocked. For example, if, upon the opening of a door of an 80-foot container, it is determined that the load wall of a loaded container extends 20 feet into the container and after 1 hour that load wall has moved 20 feet further back (to 40 feet total) from the image capture apparatus or the edge of the container, the emptiness can be determined by subtracting the 20 unused feet from both the average depth of a load wall (40 feet) and the total depth (80 feet) and dividing the adjusted average depth by the adjusted total depth, resulting in 0.33, or 33%. Thereafter, this value may be used in a manner that is similar or the same to the way that emptiness is considered in the ETC determinations operations recited above.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations. Moreover, no steps of any method disclosed herein shall be understood to have any specific order unless it is expressly stated that no other order is possible or required by the remaining steps of the respective method.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

We claim:

1. A method of estimating and utilizing an estimated time to completion (ETC) of loading a container, the method comprising:
    capturing, via an image capture apparatus, a three-dimensional image representative of a three-dimensional formation, the three-dimensional image having a plurality of points with three-dimensional point data;
    based at least in part on a first sub-plurality of the points representing goods being loaded into the container, determining, by a controller, an active load time for the container;
    based at least in part on a second sub-plurality of the points representing planes corresponding to substantially flat surfaces, determining, by the controller, a fullness of the container;
    estimating, by the controller, the ETC based on the active load time and on the fullness,
    wherein the operation of estimating the ETC is defined by $$ETC = t_l\left(\frac{D}{f} - 1\right)$$

where $t_l$ is the active load time,
    where f is the fullness expressed as a first percentage in decimal form, and
    where D is a second percentage expressed in decimal form of a total depth of the container to which the loading is estimated; and
    based on the ETC, at least one of:
        adjusting personnel engaged in loading the container;
        adjusting loading equipment used in loading the container;
        adjusting a routing of a second container; or
        identifying movement of freight that is slower than expected.

2. The method of claim 1, wherein the image capture apparatus includes a three-dimensional camera, and wherein the plurality of points represents a point cloud.

3. The method of claim 1, wherein the operation of determining the active load time for the container includes subtracting an idle load time of the container from a total elapsed load time of the container.

4. The method of claim 3, wherein the idle load time is based on an amount of time over which no change in the movement of items within the container is detected.

5. The method of claim 4, wherein the amount of time is comprised of a plurality of time samples over which no change in the movement of items within the container is detected.

6. The method of claim 1, wherein the operation of determining the fullness of the container includes:
    detecting at least one shape having a substantially flat surface that is substantially orthogonal to a floor of the container and is substantially facing the image capture apparatus;
    determining an average depth value of all the at least one shape having the substantially flat surface; and determining the fullness based on the average depth value and a total depth of the container.

7. The method of claim 6, wherein the operation of determining the fullness includes:
subtracting the average depth value from the total depth value to obtain an estimated occupied depth; and
dividing the estimated occupied depth by the total depth.

8. A method of estimating and utilizing an estimated time to completion (ETC) of unloading a container, the method comprising:
capturing, via an image capture apparatus, a three-dimensional image representative of a three-dimensional formation, the three-dimensional image having a plurality of points with three-dimensional point data;
based at least in part on a first sub-plurality of the points representing goods being loaded into the container, determining, by a controller, an active unload time for the container;
based at least in part on a second sub-plurality of the points representing planes corresponding to substantially flat surfaces, determining, by the controller, a fullness of the container;
estimating, by a controller, the ETC based on the active unload time and on the fullness,
wherein the operation of estimating the ETC is defined by $$ETC = t_l\left(\frac{1}{(1-f)} - 1\right)$$

where $t_l$ is the active unload time, and
where f is the fullness expressed as a percentage in decimal form; and
based on the ETC, at least one of:
adjusting personnel engaged in unloading the container;
adjusting loading equipment used in unloading the container;
adjusting a routing of a second container; or
identifying movement of freight that is slower than expected.

9. The method of claim 8, wherein the image capture apparatus includes a three-dimensional camera, and wherein the plurality of points represents a point cloud.

10. The method of claim 8, wherein the operation of determining the active unload time for the container includes subtracting an idle load time of the container from a total elapsed unload time of the container.

11. The method of claim 10, wherein the idle load time is based on an amount of time over which no change in the movement of items within the container is detected.

12. The method of claim 11, wherein the amount of time is comprised of a plurality of time samples over which no change in the movement of items within the container is detected.

13. The method of claim 8, wherein the operation of determining the fullness of the container includes:
detecting at least one shape having a substantially flat surface that is substantially orthogonal to a floor of the container and is substantially facing the image capture apparatus;
determining an average depth value of all the at least one shape having the substantially flat surface; and
determining the fullness based on the average depth value and a total depth of the container.

14. The method of claim 13, wherein the operation of determining the fullness includes:
subtracting the average depth value from the total depth value to obtain an estimated occupied depth; and
dividing the estimated occupied depth by the total depth.

15. A system for estimating and utilizing an estimated time to completion (ETC) of loading a container, comprising:
a container monitoring unit (CMU) having:
a housing;
an imaging assembly at least partially within the housing and operable to capture a three-dimensional image representative of a three-dimensional formation, the three-dimensional image having a plurality of points with three-dimensional point data; and
a controller communicatively connected to the imaging assembly, the controller operable to:
analyze a first sub-plurality of the points representing goods being loaded into the container to determining an active load time for the container;
analyze a second sub-plurality of the points representing planes corresponding to substantially flat surfaces to determining a fullness of the container;
estimate the ETC based on the active load time and on the fullness; and
transmit the ETC to a server communicatively coupled to the controller,
wherein the controller is operable to estimate the ETC based on the active load time and on the fullness by solving $$ETC = t_l\left(\frac{D}{f} - 1\right)$$

where $t_l$ is the active load time,
where f is the fullness expressed as a first percentage in decimal form, and
where D is a second percentage expressed in decimal form of a total depth of the container to which the loading is estimated; and
the server, wherein based on the ETC, the server is configured to transmit to a client device data relating to at least one of:
adjusting personnel engaged in loading the container;
adjusting loading equipment used in loading the container;
adjusting a routing of a second container; or
identifying movement of freight that is slower than expected.

16. The system of claim 15, wherein the controller is operable to analyze the first sub-plurality of the points to determining the active load time by subtracting an idle load time of the container from a total elapsed load time of the container.

17. The system of claim 15, wherein the controller is operable to analyze the second sub-plurality of the points to determining the fullness of the container by:
detecting at least one shape having a substantially flat surface that is substantially orthogonal to a floor of the container and is substantially facing the CMU;
determining an average depth value of all the at least one shape having the substantially flat surface; and
determining the fullness based on the average depth value and a total depth of the container.

* * * * *